(12) United States Patent
Myung et al.

(10) Patent No.: US 10,276,813 B2
(45) Date of Patent: Apr. 30, 2019

(54) BACKPLATE AND FOLDABLE DISPLAY DEVICE INCLUDING THE SAME

(71) Applicant: LG Display Co., Ltd., Seoul (KR)

(72) Inventors: Noh-Jin Myung, Paju-si (KR);
Joo-Hye Park, Anyang-si (KR);
Byoung-Har Hwang, Goyang-si (KR);
Sang-Hak Shin, Goyang-si (KR);
Tae-Hyeong Kwak, Goyang-si (KR);
Yu-Lim Won, Incheon (KR)

(73) Assignee: LG Display Co., Ltd., Seoul (KR)

( * ) Notice: Subject to any disclaimer, the term of this patent is extended or adjusted under 35 U.S.C. 154(b) by 53 days.

(21) Appl. No.: 15/359,925

(22) Filed: Nov. 23, 2016

(65) Prior Publication Data
US 2017/0170417 A1    Jun. 15, 2017

(30) Foreign Application Priority Data

Dec. 11, 2015  (KR) .................. 10-2015-0176739

(51) Int. Cl.
| | | |
|---|---|---|
| H01L 51/00 | (2006.01) | |
| H01L 27/32 | (2006.01) | |
| G09F 9/30 | (2006.01) | |
| H01L 51/52 | (2006.01) | |

(52) U.S. Cl.
CPC ...... *H01L 51/0097* (2013.01); *H01L 27/3244* (2013.01); *G09F 9/301* (2013.01); *H01L 51/5237* (2013.01); *H01L 2251/5338* (2013.01); *H01L 2251/558* (2013.01); *Y02E 10/549* (2013.01)

(58) Field of Classification Search
CPC ............. H01L 51/0097; H01L 27/3244; H01L 51/5237; H01L 33/483; H01L 23/06
See application file for complete search history.

(56) References Cited

U.S. PATENT DOCUMENTS

| | | | |
|---|---|---|---|
| 2013/0169515 A1* | 7/2013 | Prushinskiy | G06F 1/1652 345/55 |
| 2015/0004334 A1* | 1/2015 | Bae | B32B 38/0008 428/12 |
| 2015/0035777 A1* | 2/2015 | Hirakata | G06F 1/1652 345/173 |
| 2016/0014881 A1* | 1/2016 | Shin | G06F 1/1652 361/749 |
| 2016/0181572 A1* | 6/2016 | Prushinskiy | G06F 1/1652 257/40 |
| 2016/0187931 A1* | 6/2016 | Myung | G06F 1/1652 361/679.3 |
| 2016/0257052 A1* | 9/2016 | Sun | B29C 49/0073 |
| 2016/0338219 A1* | 11/2016 | Seo | G06F 1/1652 |
| 2017/0062742 A1* | 3/2017 | Kim | H01L 51/0097 |

(Continued)

*Primary Examiner* — Jamie C Niesz
(74) *Attorney, Agent, or Firm* — Polsinelli PC

(57) ABSTRACT

A backplate having a folding region and an unfolding region adjacent to the folding region includes: first and second material layers corresponding to the folding and unfolding regions; and a third material layer between the first and second material layers, the third material layer is more rigid than the first and second materials layers, wherein the first and second material layers extend from the folding region to the unfolding regions such that a thickness of the first and second material layers is gradually reduced from the folding region to the unfolding region.

20 Claims, 7 Drawing Sheets

(56) References Cited

U.S. PATENT DOCUMENTS

2017/0099072 A1* 4/2017 Moon ................. H04M 1/0216
2017/0196078 A1* 7/2017 Choi ..................... G06F 1/1641
2017/0263892 A1* 9/2017 Senoo ................ H01L 51/0097

* cited by examiner

BACKPLATE AND FOLDABLE DISPLAY DEVICE INCLUDING THE SAME

CROSS-REFERENCE TO RELATED APPLICATIONS

The present application claims the benefit of priority of Korean Patent Application No. 10-2015-0176739 filed in the Republic of Korea on Dec. 11, 2015, which is hereby incorporated by reference in its entirety for all purposes as if fully set forth herein.

BACKGROUND

Field of the Disclosure

The present disclosure relates to a display device, and more particularly to a backplate and a foldable display device including the same. Although the present disclosure is suitable for a wide scope of applications, it is particularly suitable for a backplate and a foldable display device where a physical border line is not recognized even when the backplate includes different materials.

Discussion of the Background

Recently, as the information society progresses, display devices processing and displaying a large amount of information have rapidly advanced and various flat panel displays (FPDs) have been developed. Specifically, the FPDs such as a liquid crystal display (LCD) device, a plasma display panel (PDP) device, a field emission display (FED) device, an electroluminescence display (ELD) device and an organic light emitting diode (OLED) display device having superior performance with a thin profile, a light weight, and a low power consumption have been substitutes for a cathode ray tube (CRT).

Since the FPD uses a glass substrate with a heat resistance during a fabrication process, there exist limitations in the light weight, the thin profile and the flexibility of the FPD. As a result, a flexible display device which performs a display function even when bent by using a flexible material such as plastic instead of glass has been researched as a next generation FPD.

The flexible display devices may be classified into: an unbreakable display device which has a relatively high durability; a bendable display device which is capable of being bent; a rollable display device which is capable of being rolled; and a foldable display device which is capable of being folded. The flexible display device has advantages in a space application and interior decoration and design and has various other applications.

Specifically, a foldable display device which is carried in a folded state and displays an image in an unfolded state. The foldable display device may be applied to a television and a monitor as well as a mobile device such as a mobile phone, an ultra mobile personal computer, an e-book and an e-paper. The foldable display device includes a display panel for displaying an image, a backplate under the display panel for supporting the display panel and a cover window over the display panel for protecting the display panel.

Since all of the display panel, the backplate and the cover window are formed of a very thin film for the foldable display device to be folded and unfolded, the foldable display device has a relatively low impact resistance. Recently, for improving the impact resistance of the foldable display device, the backplate where a folding region is formed of a soft material and an unfolding region is formed of a hard material for rigidity has been suggested.

However, although the impact resistance of the unfolding region is improved, the impact resistance of the folding region is not improved. Specifically, since the backplate includes different materials of the soft material and the hard material, a physical border line between the folding region and the unfolding region is recognized through the display panel due to a step difference between the different materials or a difference in pressing property between the folding region and the unfolding region.

FIGS. 1A and 1B are views showing display panels without and with a backplate, respectively, according to the related art.

In FIG. 1A, a lamp image reflected in a display panel without a backplate has a straight shape without a bent portion. As a result, a physical border line between a folding region and an unfolding region of the display panel without the backplate is not recognized.

In FIG. 1B, a lamp image reflected in a display panel with a backplate formed of different materials has a straight shape including bent portions A. As a result, a physical border line between a folding region and an unfolding region of the display panel with the backplate is recognized, and a display quality of the display panel can be deteriorated.

SUMMARY

Accordingly, the present disclosure is directed to a backplate and a foldable display device including the same that substantially obviates one or more of problems due to limitations and disadvantages of the prior art.

In accordance with the present disclosure, as embodied and broadly described herein, the present disclosure provides a backplate having a folding region and an unfolding region at a side of the folding region including: first and second foldable material layers corresponding to the folding region; and a third material layer between the first and second foldable material layers, the third material layer corresponding to the folding region, wherein the first and second foldable material layers extend from the folding region to the unfolding regions such that a thickness of the first and second soft material layers is gradually reduced from the folding region to the unfolding region.

In another aspect, the present disclosure provides a foldable display device including: a backplate having a folding region and an unfolding region at a side of the folding region; and a display panel over the backplate, wherein the backplate comprises: first and second soft material layers corresponding to the folding region; and a hard material layer between the first and second soft material layers, the hard material layer corresponding to the folding region, wherein the first and second soft material layers extend from the folding region to the unfolding regions such that a thickness of the first and second soft material layers is gradually reduced from the folding region to the unfolding region.

It is to be understood that both the foregoing general description and the following detailed description are exemplary and explanatory and are intended to provide further explanation of the embodiments as claimed.

BRIEF DESCRIPTION OF THE DRAWINGS

The accompanying drawings, which are included to provide a further understanding of the disclosure and are incorporated in and constitute a part of this specification, illustrate embodiments and together with the description serve to explain the principles of the disclosure. In the drawings.

DETAILED DESCRIPTION

Reference will now be made in detail to the present disclosure, examples of which are illustrated in the accompanying drawings.

Figure 2:
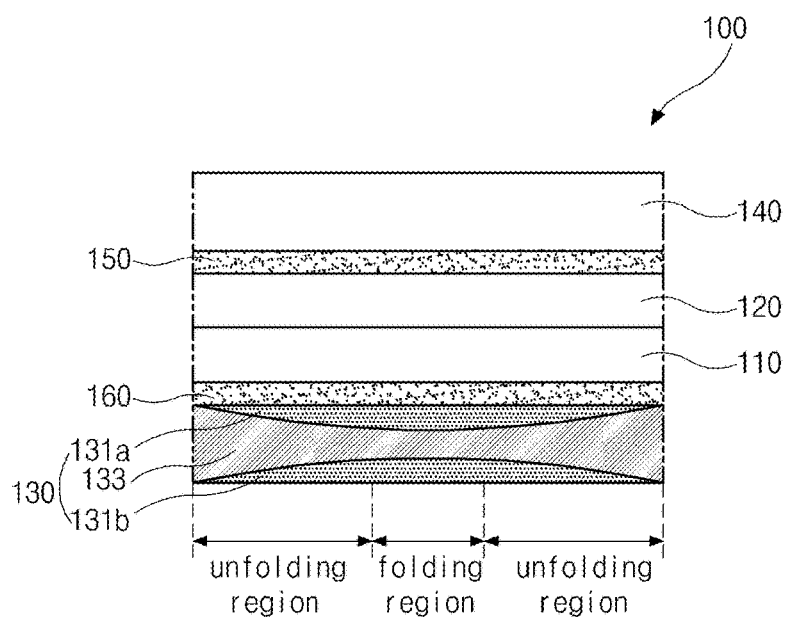
FIG. 2 is a cross-sectional view showing a foldable display device according a first aspect of the present disclosure.
Figure 3:
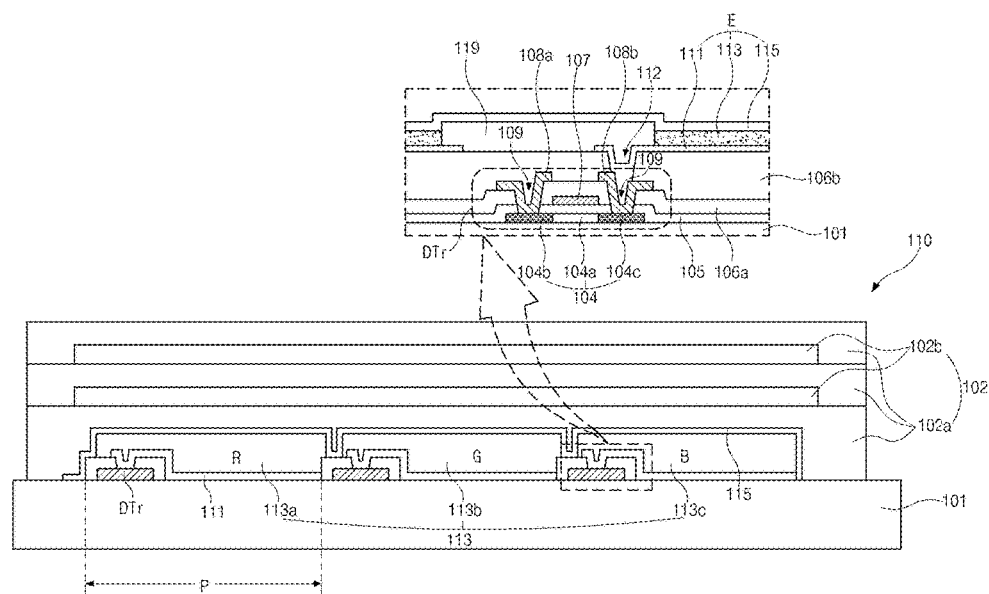
FIG. 3 is a cross-sectional view showing a display panel of the foldable display device according to the first aspect of the present disclosure.

FIG. 2 is a cross-sectional view showing a foldable display device according a first aspect of the present disclosure, and FIG. 3 is a cross-sectional view showing a display panel of the foldable display device according to the first aspect of the present disclosure.

In FIGS. 2 and 3, a foldable display device 100 includes a display panel 110 for displaying an image, a touch panel 120 for sensing a touch, a backplate 130 for supporting the display panel 110 and a cover window 140 for protecting the display panel 110.

The backplate 130 is disposed under the display panel 110 displaying an image to an upper direction, and the cover window 140 is disposed over the display panel 110. The touch panel 120 is disposed between the display panel 110 and the cover window 140.

The display panel 110 may include one of a liquid crystal display (LCD) device, a plasma display panel (PDP) device, a field emission display (FED) device, an electroluminescent display (ELD) device and an organic light emitting diode (OLED) display device. For example, the display panel 110 may be the OLED display device as a flexible display device which keeps displaying an image even when bent like a paper.

Since a backlight unit for the LCD device of a non-emissive type is not required for the OLED display device of an emissive type, the OLED display device can have a light weight and a thin profile. In addition, the OLED display device has advantages in a viewing angle, a contrast ratio and a power consumption as compared with the LCD device. Further, the OLED display device can be driven with a low direct current (DC) voltage and has a rapid response speed.

Moreover, since the inner elements of the OLED display device have a solid phase, the OLED display device has an excellent durability against an external impact and has a wide available temperature range. Specifically, since the OLED display device is fabricated through a simple process, the fabrication cost is reduced as compared with the LCD device.

In the display panel 110 of the OLED display device, a substrate 101 having a driving thin film transistor (TFT) DTr and a light emitting diode E is encapsulated by a protecting film 102.

A semiconductor layer 104 is formed on the substrate 101 in each pixel region P. The semiconductor layer 104 includes an active region 104a of intrinsic polycrystalline silicon and source and drain regions 104b and 104c of impurity-doped polycrystalline silicon at both sides of the active region 104a. A channel for a current is generated in the active region 104a when in operation.

A gate insulating layer 105 is formed on the semiconductor layer 104, and a gate electrode 107 is formed on the gate insulating layer 105 corresponding to the active region 104a of the semiconductor layer 104. Although not shown, a gate line connected to the gate electrode 107 is formed on the gate insulating layer 105 to extend along a direction.

A first interlayer insulating layer 106a is formed on the gate electrode 107 and the gate line. The first interlayer insulating layer 106a and the gate insulating layer 105 have first and second semiconductor contact holes 109 exposing portions of the source and drain regions 104a and 104c, respectively.

Source and drain electrodes 108a and 108b are formed on the first interlayer insulating layer 106a. The source and drain electrodes 108a and 108b are spaced apart from each other and are connected to the source and drain regions 104b and 104c through the first and second semiconductor contact holes 109, respectively.

A second interlayer insulating layer 106b is formed on the source and drain electrodes 108a and 108b. The second interlayer insulating layer 106b has a drain contact hole 112 exposing a portion of the drain electrode 108b.

The source and drain electrodes 108a and 108b, the gate electrode 107 and the semiconductor layer 104 constitute a driving thin film transistor (TFT) DTr.

Although not shown, a data line may be formed on the first interlayer insulating layer 106a. The data line may cross the gate line to define the pixel region P. In addition, a switching TFT having the same structure as the driving TFT DTr may be connected to the driving TFT DTr.

Although the switching TFT and the driving TFT DTr have a coplanar type and the semiconductor layer 104 includes polycrystalline silicon in a first aspect of FIG. 3, the switching TFT and the driving TFT DTr may have a bottom gate type and the semiconductor layer 104 may be formed of amorphous silicon in another aspect of the present disclosure.

A first electrode 111 is formed on the second interlayer insulating layer 106b in a display area of the pixel region P. For example, the first electrode 111 may be formed of a material with a relatively high work function to function as an anode of a light emitting diode E. The first electrode 111 is connected to the drain electrode 108b of the driving TFT DTr.

The first electrode 111 is disposed in each pixel region P, and a bank layer 119 is disposed between the first electrodes 111 of the adjacent pixel regions P. As a result, the first electrode 111 is separated in each pixel region P with the bank layer 119 as a border part between the pixel regions P.

An organic emitting layer 113 is formed on the first electrode 111. For example, the organic emitting layer 113 may have a single layer or a multiple layer including a hole injecting layer (HIL), a hole transporting layer (HTL), an emitting material layer (EML), an electron transporting layer (ETL) and an electron injecting layer (EIL).

A second electrode 115 is formed on the organic emitting layer 113. For example, the second electrode 115 may has a double layer including a metallic material of a relatively small thickness and a relatively low work function and a transparent conductive material of a relatively great thickness such that the display panel 110 has a top emission type where a light of the organic emitting layer 113 is emitted through the second electrode 115. Alternatively, the second electrode 115 may be formed of an opaque metallic material such that the display panel 110 has a bottom emission type where light of the organic emitting layer 113 is emitted through the first electrode 111.

When a voltage is applied to the first and second electrodes 111 and 115 according to a selected color signal, a hole injected from the first electrode 111 and an electron injected from the second electrode 115 are transported to the organic emitting layer 113 to constitute an exciton. When the exciton transitions from an excited state to the ground state, light is generated and is emitted as a visible ray. The light passes though the first electrode 111 or the second electrode 115 and the display panel 110 displays an image.

A protecting film 102 of a thin film is formed on the driving TFT DTr and the light emitting diode E such that the display panel 101 is encapsulated by the protecting film 102. For preventing penetration of the external oxygen and the external moisture into the display panel 110, the protecting film 102 may be formed of at least two inorganic protecting films 102a and at least one organic protecting film 102b between the at least two inorganic protecting films 102a to complement an impact resistance of the at least two inorganic protecting films 102a.

The substrate 101 may include polyimide with a relatively small thickness for flexibility. Since the substrate 101 of a polyimide film is not suitable for a process of forming elements such as the driving TFT DTr, the process of forming the elements such as the driving TFT DTr is performed to the substrate 101 of a polyimide film attached to a carrier substrate such as a glass substrate, and the display panel 110 is obtained by detaching the substrate 101 of a polyimide film from the carrier substrate.

The touch panel 120 is disposed over the display panel 110 such that the display panel 110 and the touch panel 120 are attached to each other through an adhesive layer (not shown).

Although not shown, the touch panel 120 may include a first touch film having a first touch electrode and a second touch film having a second touch electrode, and the first and second touch films may be spaced apart and face each other. The first touch electrode may be formed on the entire surface of the first touch film and may be formed of a transparent conductive material such as indium tin oxide (ITO) and indium zinc oxide (IZO). The second touch electrode may be formed on the second touch film to have a shape of a plurality of bars and may be formed of a metallic material such as aluminum (Al), aluminum alloy (e.g., aluminum neodymium (AlNd)), magnesium (Mg), gold (Au) and silver (Ag).

The first and second touch electrodes constitute a touch sensor. As a result, when an input means such as a finger and a pen contacts a point on the first touch film, the first touch electrode of the first touch film corresponding to the point and the second touch electrode of the second touch film may be electrically connected, and a voltage value which is changed by a resistance value of the point is read. A control unit may detect a coordinate of the point according to a potential change.

The display panel 110 and the touch panel 120 attached to each other are modularized by the cover window 140 and the backplate 130. For example, the cover window 140 may be attached to a front surface of the display panel 110 through a first optical adhesive layer 150 to protect the display panel 110. The backplate 130 may be attached to a rear surface of the display panel 110 through a second optical adhesive layer 160 to support the display panel 110.

The first and second optical adhesive layers 150 and 160 may include optically clear adhesive (OCA) and may have a thickness of about 100 µm to about 300 µm. When the first and second optical adhesive layers 150 and 160 have a thickness smaller than about 100 µm, it becomes difficult to modularize the display panel 100, the touch panel 120, the cover window 140 and the backplate 130 because of a weak adhesive force. When the first and second optical adhesive layers 150 and 160 have a thickness greater than about 100 µm, it becomes difficult to fold the foldable display device 100.

The cover window 140 protects the display panel 110 and the touch panel 120 from an external impact and transmits light emitted from the display panel 110 so that an image displayed by the display panel 110 can be seen from the exterior.

The cover window 140 may include a material having a relatively high impact resistance and a relatively high light transmittance such as polymethylmethacrylate (PMMA), polycarbonate (PC), cycloolefin polymer (COP), polyethylene terephthalate (PET), polyimide (PI) and polyamide (PA).

The backplate 130 is attached to the rear surface of the display panel 110 to support the display panel 110 and to complement the rigidity of the thin substrate 101 of the display panel 110.

The backplate 130 has a mixed structure including soft material layers 131a and 131b and a hard (or rigid) material layer 133. Throughout the present disclosure, the hard (or rigid) material layer is more rigid than the soft material layers, and the soft material layers may include foldable layers. Specifically, the backplate 130 may be classified into a folding region and an unfolding region. The backplate 130 has a sandwich structure where the hard material layer 133 is disposed between the soft material layers 131a and 131b in the folding region, and a thickness of the soft material layers 131a and 131b extending from the folding region is gradually reduced in the unfolding region.

In the foldable display device 100 according to the first aspect of the present disclosure, recognition of a physical border line between the folding region and the unfolding region due to a step difference or a difference in pressing property can be avoided by implementing different materials of the soft and hard materials of the backplate 130. As a result, deterioration of a display quality of the display panel 110 is prevented.

In addition, since an impact resistance of the folding region of the backplate 130 is improved without any restrictions in folding and unfolding of the foldable display device 100, an impact resistance of the folding region of the foldable display device 100 can be improved.

Figure 1A:
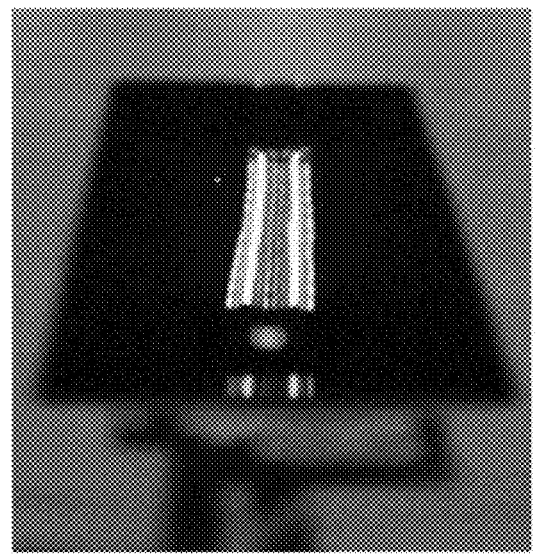
FIGS. 1A and 1B are views showing display panels without and with a backplate, respectively, according to the related art.
Figure 1B:
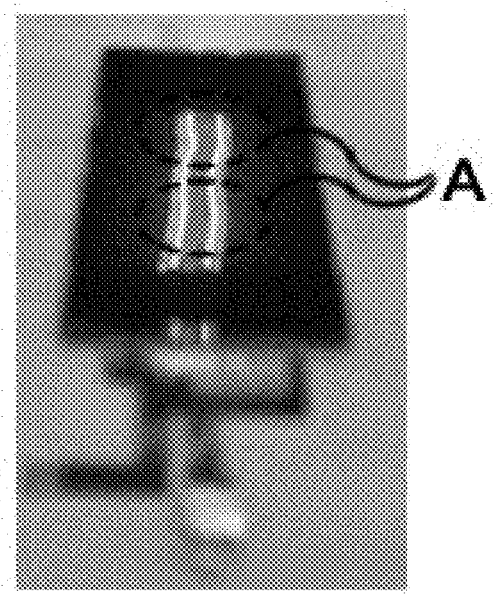
Figure 4:
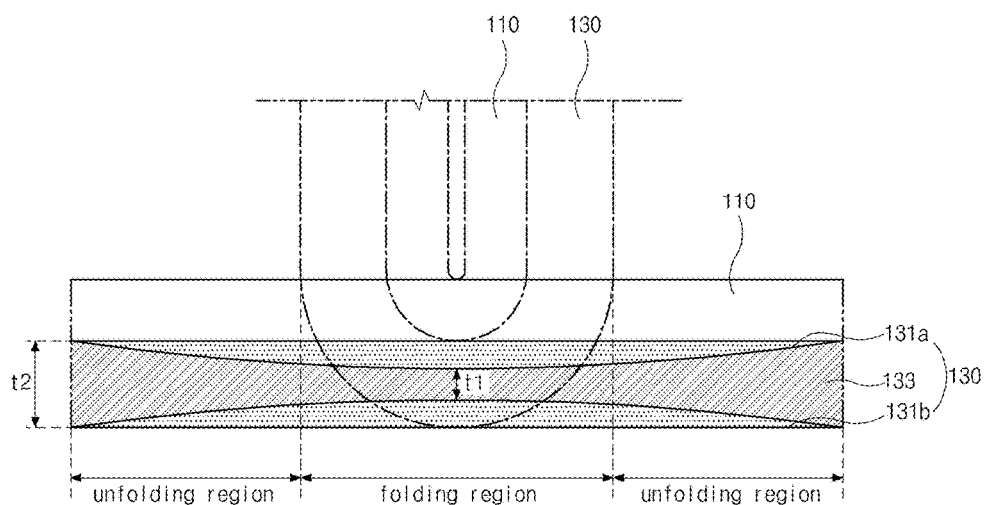
FIG. 4 is a cross-sectional view showing a backplate according the first aspect of the present disclosure.
Figure 5A:
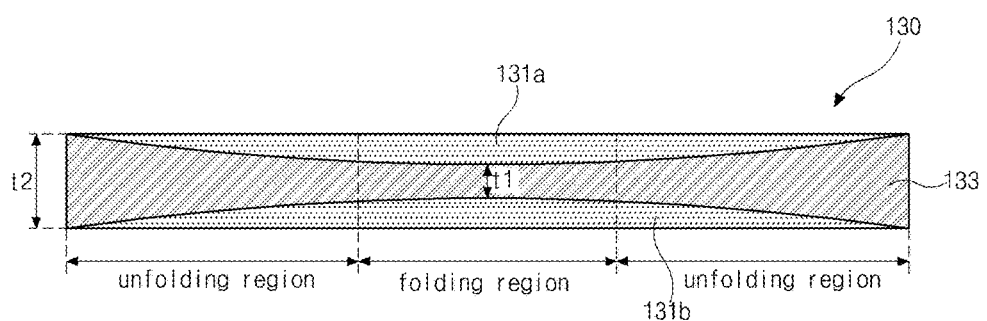
FIGS. 5A and 5B are cross-sectional views showing various backplates of the foldable display device according to the first aspect of the present disclosure.
Figure 5B:
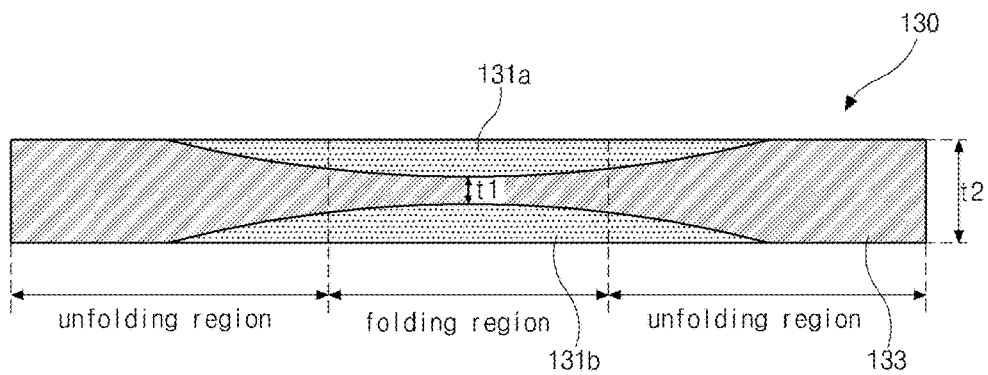

FIG. 4 is a cross-sectional view showing a backplate, and FIGS. 5A and 5B are cross-sectional views showing various backplates of the foldable display device according to the first aspect of the present disclosure. For convenience sake, a cover window 140 (of FIG. 2), a touch panel 120 (of FIG. 2) and first and second optical adhesive layers 150 and 160 (of FIG. 1) are omitted in FIGS. 4, 5A and 5B.

In FIG. 4, a backplate 130 having a folding region and an unfolding region is disposed on a rear surface of a display panel 110. The folding region may be defined as an area where the foldable display device 100 (of FIG. 2) has a curvature when it is folded and the unfolding region may be defined as an area where the foldable display device 100 has a flat state (no curvature or 0 curvature) even when it is folded.

The backplate 130 in the folding region has a sandwich structure including a first soft material layer 131*a* contacting the rear surface of the display panel 110, a second soft material layer 131*b* facing the first soft material layer 131*a* to constitute a rear surface of the backplate 130, and a hard material layer 133 between the first and second soft material layers 131*a* and 131*b*. A thickness of each of the first and second soft material layers 131*a* and 131*b* is gradually reduced from the folding region to the unfolding region.

Since the thickness of each of the first and second soft material layers 131*a* and 131*b* is gradually reduced from the folding region to the unfolding region, a border between the folding region and the unfolding region of the backplate 130 becomes blurry or disappears. Accordingly, a physical border line between the folding region and the unfolding region due to a step difference between the different materials or a difference in pressing property between the folding region and the unfolding region is prevented from being recognized. As a result, a display quality of the display panel 110 is prevented from being deteriorated.

In addition, since the backplate 130 has the folding region and the unfolding region and the hard material layer 133 is disposed in the folding region, an impact resistance of the folding region of the backplate 130 is improved without any restrictions in folding and unfolding of the foldable display device 100. As a result, an impact resistance of the folding region of the foldable display device 100 can be improved.

An end of each of the first and second soft material layers 131*a* and 131*b* may be disposed at an end portion of the unfolding region. Alternatively, the end of each of the first and second soft material layers 131*a* and 131*b* may be disposed at the border between the folding region and the unfolding region such that the unfolding region includes the hard material layer 133 only without the first and second soft material layers 131*a* and 131*b*.

The first and second soft material layers 131*a* and 131*b* may be formed of one of polyurethane (PU), thermoplastic polyurethane (TPU), silicon (Si) and polydimethylacrylamide (PDMA), and the hard material layer 133 may be formed of one of a metallic material such as amorphous metal, polymethylmethacrylate (PMMA), polycarbonate (PC), polyvinylalcohol (PVA), acrylonitrile-butadiene-styrene (ABS) and polyethylene terephthalate (PET).

The hard material layer 133 in the folding region may have a first thickness t1 of about 100 μm to about 200 μm. When the backplate 130 has a thickness of about 1 mm, the hard material layer 133 may have a thickness of about 200 μm and each of the first and second soft material layers 131*a* and 131*b* may have a thickness of about 400 μm in the folding region.

When the hard material layer 133 in the folding region has a thickness smaller than about 100 μm, an effect of the hard material layer 133 is reduced. When the hard material layer 133 in the folding region has a thickness greater than about 200 μm, the foldable display device 100 has limitation in folding and unfolding. For example, when the hard material layer 133 in the folding region has a thickness smaller than about 100 μm, the physical border line between the folding region and the unfolding region due to the different materials of the backplate 130 may be recognized through the display device 110. When the hard material layer 133 in the folding region has a thickness greater than about 200 μm, the backplate 130 may have plastic deformation through a process of folding the foldable display device 100. Since limitation in folding and unfolding of the foldable display device 100 is generated, the display quality of the display panel 110 becomes low and appearance of the foldable display device 100 is deteriorated.

The hard material layer 133 in the unfolding region may have a second thickness t2 of about 1 mm to about 2 mm. When the thickness of the hard backplate 130 in the unfolding region has a thickness smaller than about 1 mm, a function for the backplate 130 of the hard material layer 133 of the unfolding region is reduced. When the thickness of the hard backplate 130 in the unfolding region has a thickness greater than about 2 mm, a total thickness of the foldable display device 100 increases.

In the backplate 130 of FIG. 5A, the first and second soft material layers 131*a* and 131*b* of the folding region extend to a side end portion of the unfolding region. The hard material layer 133 of the folding region has a first thickness t1 of about 100 μm to about 200 μm, and the side end portion of the unfolding region has a second thickness t2 of about 1 mm to about 2 mm.

In the backplate 130 of FIG. 5B, the first and second soft material layers 131*a* and 131*b* of the folding region extend to a central portion of the unfolding region. The hard material layer 133 of the folding region has a first thickness t1 of about 100 μm to about 200 μm, and the unfolding region of the hard material layer 133 without the first and second soft material layers 131*a* and 131*b* has a second thickness t2 of about 1 mm to about 2 mm.

In the foldable display device 200 (of FIG. 2) according to the first aspect of the present disclosure, the backplate 130 is defined by the folding region and the unfolding region. In addition, the backplate 130 in the folding region has a sandwich structure where the hard material layer 133 is disposed between the soft material layers 131*a* and 131*b*, and the thickness of the soft material layers 131*a* and 131*b* extending from the folding region is gradually reduced in the unfolding region. As a result, recognition of a physical border line between the folding region and the unfolding region due to a step difference or a difference in pressing property can be avoided by implementing the different materials of the soft and hard materials of the backplate 130. Accordingly, deterioration of a display quality of the display panel 110 can be prevented.

Further, since the impact resistance of the folding region of the backplate 130 is improved without limitation in folding and unfolding of the foldable display device 100, the impact resistance of the folding region of the foldable display device 100 can be improved.

Figure 6A:
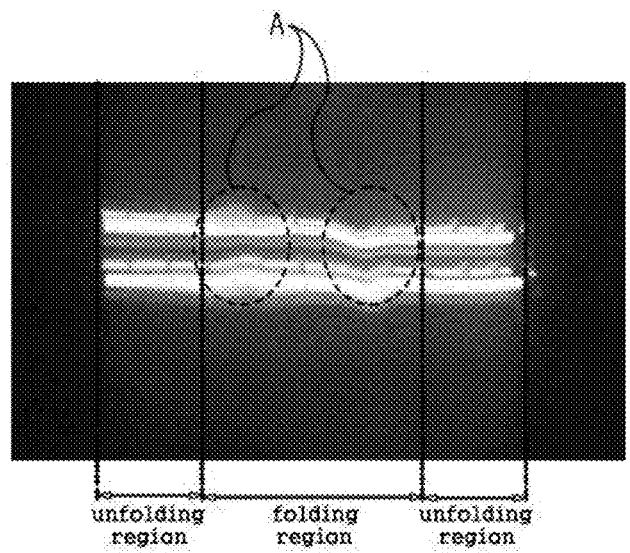
FIG. 6A is a view showing a foldable display device including a backplate according to the related art.
Figure 6B:
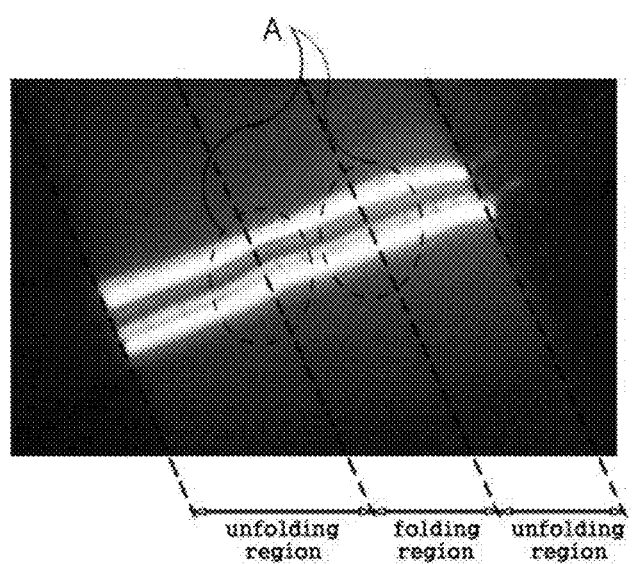
FIG. 6B is a view showing the foldable display device including the backplate according to the first aspect of the present disclosure.

FIG. 6A is a view showing a foldable display device including a backplate according to the related art, and FIG. 6B is a view showing a foldable display device including the backplate according to the first aspect of the present disclosure.

In FIG. 6A, a backplate of a foldable display device according to the related art includes a soft material in a folding region and a hard material in an unfolding region. A lamp image reflected in a display panel over the backplate has a straight shape including a bent portion A. As a result, a physical border line between the folding region and the unfolding region of the foldable display device is recognized due to a step difference or a difference in pressing property between the folding region and the unfolding region, and a display quality of the foldable display device is deteriorated.

In FIG. 6B, the backplate 130 (of FIG. 4) of the foldable display device 100 (of FIG. 2) according to the first aspect of the present disclosure includes a sandwich structure of the first and second soft material layers 131a and 131b (of FIG. 4) and the hard material layer 133 (of FIG. 4) in a folding region and a thickness of the soft material layers 131a and 131b extending from the folding region is gradually reduced in an unfolding region. A lamp image reflected in the display panel 110 (of FIG. 4) over the backplate 130 has a straight shape without a bent portion. As a result, a border between the folding region and the unfolding region of the backplate 130 becomes blurry or disappears, and a physical border line between the folding region and the unfolding region of the foldable display device 100 is not recognizable. Accordingly, a display quality of the display panel 110 can be improved.

Figure 7A:
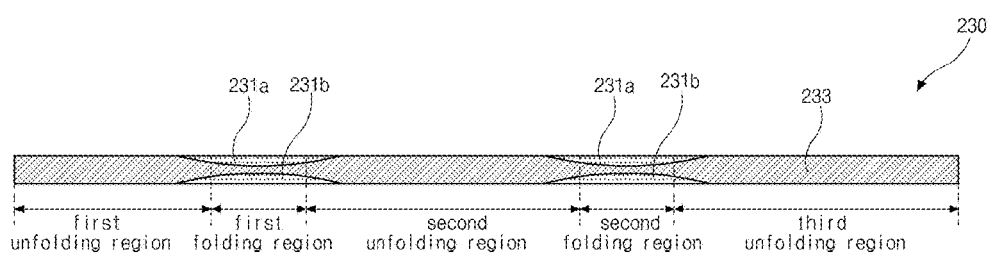
FIGS. 7A and 7B are cross-sectional views showing a backplate in an unfolded state and a folded state, respectively, of a foldable display device according to a second aspect of the present disclosure.
Figure 7B:
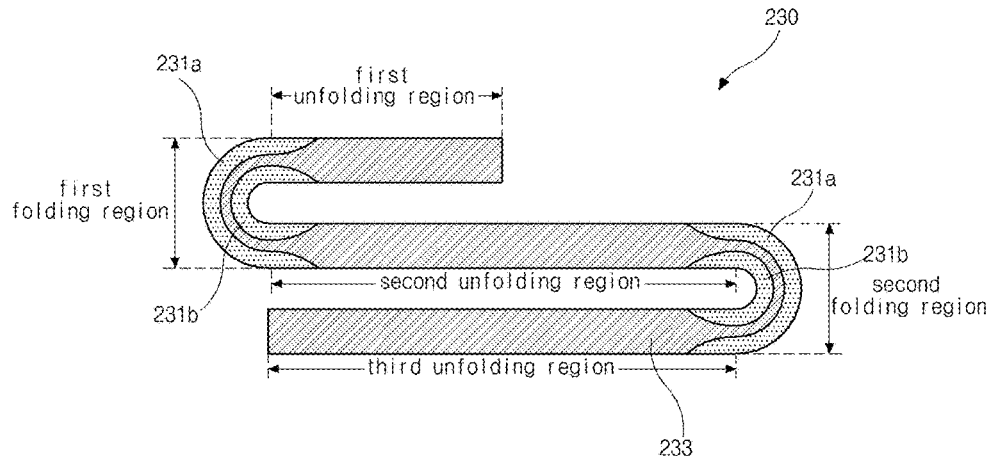

FIGS. 7A and 7B are cross-sectional views showing a backplate in an unfolded state and a folded state, respectively, of a foldable display device according to a second embodiment of the present disclosure.

In FIG. 7A, a backplate 230 of a foldable display device according to a second aspect of the present disclosure has first and second folding regions and first to third unfolding regions. The first folding region is disposed between the first and second unfolding regions, and the second folding region is disposed between the second and third unfolding regions.

The backplate 230 of the first and second folding regions includes a first soft material layer 231a, a second soft material layer 231b and a hard material layer 233 between the first and second soft material layers 231a and 231b. The first and second soft material layers 231a and 231b of the first and second folding regions extend to the first to third unfolding regions.

In FIG. 7B, the backplate 230 of the first and second folding regions is folded to have a curvature. For example, the backplate 230 of the first folding region may be folded such that a front surface of the backplate 230 of the first unfolding region faces a front surface of the backplate 230 of the second unfolding region, and the backplate 230 of the second folding region may be folded such that a rear surface of the backplate 230 of the second unfolding region faces a rear surface of the backplate 230 of the third unfolding region.

In the foldable display device according to the second aspect of the present disclosure, the backplate 230 has a plurality of folding regions where the hard material layer 233 is disposed between the first and second soft material layers 231a and 231b and a plurality of unfolding regions where the first and second soft material layers 231a and 231b extend. The foldable display device may have various folded shapes using the plurality of folding regions and the plurality of unfolding regions alternately disposed with each other.

Figure 8A:
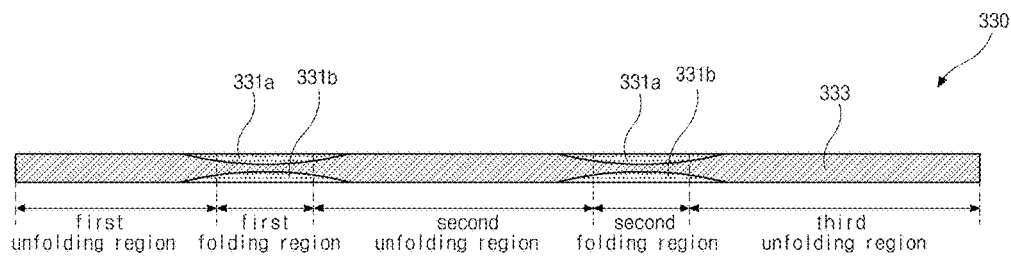
FIGS. 8A and 8B are cross-sectional views showing a backplate in an unfolded state and a folded state, respectively, of a foldable display device according to a third aspect of the present disclosure.
Figure 8B:
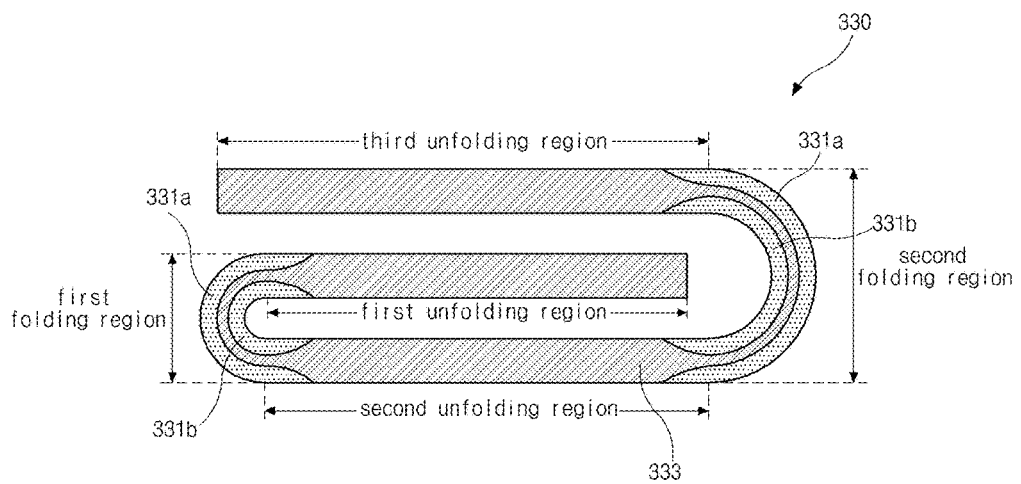

FIGS. 8A and 8B are cross-sectional views showing a backplate in an unfolded state and a folded state, respectively, of a foldable display device according to a third aspect of the present disclosure.

In FIG. 8A, a backplate 330 of a foldable display device according to the third aspect of the present disclosure has first and second folding regions and first to third unfolding regions. The first folding region is disposed between the first and second unfolding regions, and the second folding region is disposed between the second and third unfolding regions.

The backplate 330 of the first and second folding regions includes a first soft material layer 331a, a second soft material layer 331b and a hard material layer 333 between the first and second soft material layers 331a and 331b. The first and second soft material layers 331a and 331b of the first and second folding regions extend to the first to third unfolding regions.

In FIG. 8B, the backplate 330 of the first and second folding regions is folded to have a curvature. For example, the backplate 330 of the first folding region may be folded such that a front surface of the backplate 330 of the first unfolding region faces a front surface of the backplate 330 of the second unfolding region, and the backplate 330 of the second folding region may be folded such that a rear surface of the backplate 330 of the third unfolding region faces a rear surface of the backplate 330 of the first unfolding region.

In the foldable display device according to the third aspect of the present disclosure, the backplate 330 has a plurality of folding regions where the hard material layer 333 is disposed between the first and second soft material layers 331a and 331b and a plurality of unfolding regions where the first and second soft material layers 331a and 331b extend. The foldable display device may have various folded shapes using the plurality of folding regions and the plurality of unfolding regions alternately disposed with each other.

In the foldable display device according to various aspects of the present disclosure, the backplate has the folding region and the unfolding region. The backplate has a sandwich structure where the hard material layer is disposed between the soft material layers in the folding region, and a thickness of the soft material layers extending from the folding region is gradually reduced in the unfolding region. As a result, recognition of a physical border line between the folding region and the unfolding region due to a step difference or a difference in pressing property can be avoided by implementing the different materials of the soft and hard materials of the backplate. Accordingly, deterioration of a display quality of the display panel can be prevented.

In addition, since an impact resistance of the folding region of the backplate is improved without limitation in folding and unfolding of the foldable display device, an impact resistance of the folding region of the foldable display device can also be improved.

Although the foldable display device 200 (of FIG. 2) includes the touch panel 120 (of FIG. 2) over the display panel 110 (of FIG. 4) in the first aspect, the touch panel may be removed in other aspects of the present disclosure.

It will be apparent to those skilled in the art that various modifications and variations can be made in a backplate and a foldable display device including the same of the present disclosure without departing from the sprit or scope of the disclosure. Thus, it is intended that the present disclosure covers the modifications and variations of these aspects provided they come within the scope of the appended claims and their equivalents.

What is claimed is:

1. A backplate having a folding region and a non-folding region adjacent to the folding region, comprising:
    first and second material layers corresponding to the folding region and the non-folding region; and
    a third material layer between the first and second material layers, the third material layer is more rigid than the first and second materials layers, wherein the first and second material layers extend throughout the folding region and the non-folding region, wherein a thickness of each the first and second material layers is gradually reduced from the folding region to the non-folding region, and the third material layer extends throughout the backplate and the first and second material layers are separated from each other by the third material layer.

2. The backplate of claim 1, wherein the first and second material layers extend to an end portion of the non-folding region.

3. The backplate of claim 1, wherein the first and second material layers extend to a portion of the non-folding region.

4. The backplate of claim 1, wherein the first and second material layers are formed of one of polyurethane (PU), thermoplastic polyurethane (TPU), silicon (Si) and polydimethylacrylamide (PDMA).

5. The backplate of claim 1, wherein the third material layer is formed of one of a metallic material, polymethylmethacrylate (PMMA), polycarbonate (PC), polyvinylalcohol (PVA), acrylonitrile-butadiene-styrene (ABS) and polyethylene terephthalate (PET).

6. The backplate of claim 1, wherein the third material layer corresponding to the folding region has a thickness of about 100 μm to about 200 μm.

7. The backplate of claim 6, wherein the third material layer extends from the folding region to the non-folding region such that a thickness of the third material layer gradually increases from the folding region to the non-folding region.

8. The backplate of claim 6, wherein the third material layer corresponding to the non-folding region has a thickness of about 1 mm to about 2 mm.

9. A foldable display device comprising:
a backplate having a folding region and a non-folding region adjacent to the folding region; and
a display panel over attached to the backplate,
wherein the backplate comprises:
first and second material layers corresponding to the folding region and the non-folding region; and
a third material layer between the first and second material layers, the third material layer is more rigid than the first and second material layers,
wherein the first and second material layers extend from the folding region to the non-folding region such that a thickness of each of the first and second material layers is gradually reduced from the folding region to the non-folding region, and the third material layer extends throughout the backplate and the first and second material layers are separated by the third material layer.

10. The foldable display device of claim 9, wherein the first material layer contacts a rear surface of the display panel, and second material layer constitutes at least a portion of the rear surface of the backplate.

11. The foldable display device of claim 9, further comprising a cover window over attached to the display panel.

12. A foldable display device, comprising:
a backplate having first, second and third non-folding regions, a first folding region between the first and second non-folding regions, and a second folding region between the second and third non-folding regions; and
a display panel over attached to the backplate,
wherein the backplate includes first and second foldable material layers corresponding to the folding regions, and a third material layer between the first and second foldable material layers,
wherein the first and second foldable material layers extend from the folding regions to the non-folding regions such that a thickness of each of the first and second foldable material layers is gradually reduced from the folding regions to the non-folding regions, and the third material layer extends throughout the backplate and the first and second foldable material layers are separated by the third material layer.

13. The foldable display device of claim 12, further comprising a cover window over attached to the display panel.

14. The foldable display device of claim 12, wherein the third material layer is more rigid than the first and second foldable material layers.

15. The foldable display device of claim 12, wherein the first foldable material layer contacts a rear surface of the display panel, and the second foldable material layer constitutes at least a portion of the rear surface of the backplate.

16. The foldable display device of claim 12, wherein the third material layer corresponding to the folding regions has a thickness of about 100 μm to about 200 μm.

17. The foldable display device of claim 16, wherein the third material layer corresponding to the non-folding regions has a thickness of about 1 mm to about 2 mm.

18. The foldable display device of claim 12, wherein the first folding region has a width substantially the same as the second folding region.

19. The foldable display device of claim 12, wherein the first folding region has a width substantially greater than that of the second folding region.

20. The foldable display device of claim 12, wherein the third material layer extends from the folding regions to the non-folding regions such that a thickness of the third material layer gradually increases from the folding regions to the non-folding regions.

* * * * *